(12) United States Patent
Wong

(10) Patent No.: US 8,339,200 B2
(45) Date of Patent: Dec. 25, 2012

(54) WIDE-SWING TELESCOPIC OPERATIONAL AMPLIFIER

(75) Inventor: Thomas Y. Wong, Markham (CA)

(73) Assignee: ATI Technologies ULC, Markham, Ontario (CA)

( * ) Notice: Subject to any disclaimer, the term of this patent is extended or adjusted under 35 U.S.C. 154(b) by 36 days.

(21) Appl. No.: 12/962,141

(22) Filed: Dec. 7, 2010

(65) Prior Publication Data
US 2012/0139631 A1 Jun. 7, 2012

(51) Int. Cl.
H03F 3/45 (2006.01)
(52) U.S. Cl. ........................................ 330/253; 330/257
(58) Field of Classification Search .................. 330/253, 330/257; 327/359, 563
See application file for complete search history.

(56) References Cited

U.S. PATENT DOCUMENTS

| | | | | |
|---|---|---|---|---|
| 5,587,689 A * | 12/1996 | Bowers | | 330/254 |
| 7,068,104 B2 * | 6/2006 | Burns et al. | | 330/253 |
| 7,138,865 B1 * | 11/2006 | Murden et al. | | 330/253 |
| 7,495,510 B2 * | 2/2009 | Kamakura et al. | | 330/253 |
| 7,598,788 B2 * | 10/2009 | Cao | | 327/266 |
| 7,944,298 B2 * | 5/2011 | Cabanillas et al. | | 330/253 |

OTHER PUBLICATIONS

Gulati, Kush and Lee, Hae-Seung, "A High-Swing CMOS Telescopic Operational Amplifier," IEEE Journal of Solid-State Circuits, vol. 33, No. 12, Dec. 1998, pp. 2010-2019.
Razavi, Behzad, "Design of Analog CMOS Integrated Circuits," McGraw Hill, 2000, pp. 291-307, 336-337, 356-361.

* cited by examiner

*Primary Examiner* — Khanh V Nguyen
(74) *Attorney, Agent, or Firm* — Zagorin O'Brien Graham LLP

(57) ABSTRACT

An apparatus includes a telescopic operational amplifier. The telescopic operational amplifier includes an input stage, a load, and a first cascode circuit. The first cascode circuit is coupled to a first differential node and an output node. The first differential node is coupled to one of the input stage and the load. The apparatus includes a first negative transconductance circuit coupled to the first differential node. In at least one embodiment, the first negative transconductance circuit is operable to provide a negative transconductance to compensate at least a first component of an output resistance of the telescopic operational amplifier. In at least one embodiment, the first negative transconductance circuit includes a pair of cross-coupled devices coupled to the first differential node and a current source.

22 Claims, 3 Drawing Sheets

US 8,339,200 B2

WIDE-SWING TELESCOPIC OPERATIONAL AMPLIFIER

BACKGROUND

1. Field of the Invention

This application is related to integrated circuits and, more particularly, to amplifier circuits.

2. Description of the Related Art

In general, a telescopic operational amplifier (i.e., cascode operational amplifier or telescopic cascode operational amplifier) is a single-stage operational amplifier including a differential input stage, a load, a cascode circuit including a pair of cascode devices coupled between the input stage and the output node, and another cascode circuit including a pair of cascode devices coupled between the output node and the load. Typically, a bias circuit supplies DC operating current to the amplifier. Telescopic operational amplifiers are used in a variety of mixed-signal applications, including phase-locked loops. Advantages of telescopic operational amplifiers over other operational amplifier topologies (e.g., operational transconductance amplifiers, folded cascode amplifiers, and multi-stage amplifiers) include superior stability, lower noise, and higher gain achievable in a single gain stage. However, telescopic operational amplifiers exhibit inferior input and output common-mode range as compared to other operational amplifier topologies. Those shortcomings typically do not affect amplifiers with a large enough power supply voltage and/or applications having enough voltage headroom (i.e., where the input or output voltage swing of the telescopic amplifier is relatively small as compared to the power supply voltage). As integrated circuit manufacturing processes advance to use finer geometries, power supply voltages are decreased to obtain reliable performance from CMOS devices. Accordingly, integrated circuit designers substitute conventional telescopic operational amplifiers with other amplifier topologies that have greater common-mode range than telescopic operational amplifiers, but are inferior to telescopic operational amplifiers in other aspects of performance.

SUMMARY OF EMBODIMENTS OF THE INVENTION

In at least one embodiment of the invention, an apparatus includes a telescopic operational amplifier. The telescopic operational amplifier includes an input stage, a load, and a first cascode circuit. The first cascode circuit is coupled to a first differential node and an output node. The first differential node is coupled to one of the input stage and the load. The apparatus includes a first negative transconductance circuit coupled to the first differential node. In at least one embodiment of the invention, the first negative transconductance circuit is operable to provide a negative transconductance to compensate at least a first component of an output resistance of the telescopic operational amplifier. In at least one embodiment of the invention, the first negative transconductance circuit includes a pair of cross-coupled devices coupled to the first differential node and a current source.

In at least one embodiment of the invention, a method includes compensating at least a first component of an output resistance of a telescopic operational amplifier by using a negative transconductance. In at least one embodiment of the invention, the negative transconductance compensates for a component of the output resistance associated with at least one of an input stage of the telescopic operational amplifier and a load of the telescopic operational amplifier. In at least one embodiment of the invention, the method includes compensating a second component of the output resistance of the telescopic operational amplifier by using a second negative transconductance.

In at least one embodiment of the invention, a tangible computer-readable medium encodes a representation of an integrated circuit that includes a telescopic operational amplifier. The telescopic operational amplifier includes an input stage, a load, and a first cascode circuit. The first cascode circuit is coupled to a first differential node and an output node. The first differential node is coupled to one of the input stage and the load. The integrated circuit includes a first negative transconductance circuit coupled to the first differential node. In at least one embodiment of the invention, the first negative transconductance circuit includes a pair of cross-coupled devices coupled to the first differential node and a current source.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
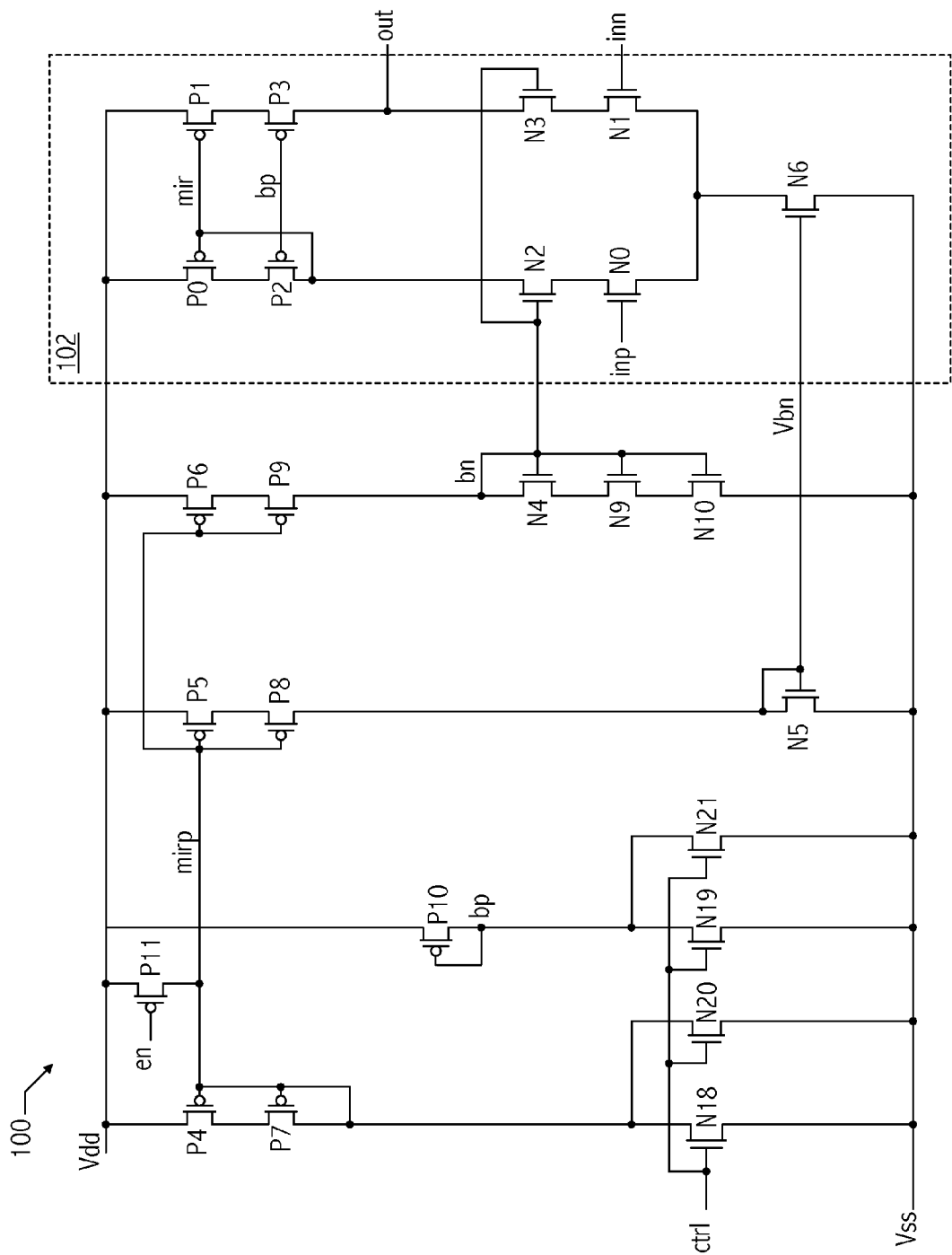
FIG. 1 illustrates a circuit diagram of an exemplary telescopic operational amplifier.

Referring to FIG. 1, an exemplary telescopic operational amplifier (e.g., telescopic operational amplifier 100) has a differential input (e.g., differential input node 'inp' and 'inn') and a single-ended output (e.g., output node 'out'). A bias voltage on a control node (e.g., node 'ctrl') establishes bias currents (e.g., bias currents based on voltages on nodes 'bp' and 'bn') in the circuit. Telescopic operational amplifier 100 is coupled to power supply nodes (e.g., Vdd and Vss). A core circuit (e.g., circuit 102) of telescopic operational amplifier 100 includes differential input devices (e.g., devices N0 and N1), a cascode circuit including n-type cascode devices (e.g., devices N2 and N3), p-type load devices (e.g., devices P0 and P1), and a cascode circuit including p-type cascode devices (e.g., devices P2 and P3). A bias device (e.g., device N6) provides a bias current for circuit 102. A voltage (e.g., the voltage on node 'bn') for cascode devices N2 and N3 is established by a current source (e.g., a current source including devices P6 and P9) that injects current into devices N4, N9, N10. A voltage (e.g., the voltage on node 'bp') for cascode devices P2 and P3 is established by a current source (e.g., a current source including devices N18, N19, N20, and N21) that injects current into device P10.

In at least one embodiment, telescopic operational amplifier 100 is configured as a unity gain buffer, e.g., the output node 'out' is connected to input node 'inn.' In such configuration and during normal operation, all devices in circuit 102 operate in a saturation region of operation of a metal-oxide semiconductor (MOS) device (hereinafter, "in saturation"). If all n-type devices and p-type devices in circuit 102 are in saturation, the resistance looking from the output node into device N3 is:

$$r_{oN3}(1+gm_{N3}\times r_{oN1})=r_{oN3}\left(1+\frac{gm_{N3}}{gds_{N1}}\right)\approx\frac{gm_{n3}}{gds_{N1}gds_{N3}},$$

where $r_o$ is output resistance of a device, gm is transconductance of a device, and gds is conductance of a device, i.e., $1/r_o$. Similarly, resistance looking from the output node into device P3 is:

$$r_{oP3}(1+gm_{P3}\times r_{oP1})=r_{oP3}\left(1+\frac{gm_{P3}}{gds_{P1}}\right)\approx\frac{gm_{P3}}{gds_{P1}gds_{P3}}.$$

Therefore, the output resistance of telescopic operational amplifier 100 is:

$$\frac{gm_{N3}}{gds_{N1}gds_{N3}}\bigg\|\frac{gm_{P3}}{gds_{P1}gds_{P3}}=\frac{1}{\frac{gds_{N1}gds_{N3}}{gm_{N3}}+\frac{gds_{P1}gds_{P3}}{gm_{P3}}}$$

$$=\frac{gm_{N3}gm_{P3}}{gm_{P3}gds_{N1}gds_{N3}+gm_{N3}gds_{P1}gds_{P3}}.$$

The open loop gain of telescopic operational amplifier 100 is:

$$A_{OL\_n\_sat\_p\_sat}=-gm_{N1}r_o=\frac{-gm_{N1}gm_{N3}gm_{P3}}{gm_{P3}gds_{N1}gds_{N3}+gm_{N3}gds_{P1}gds_{P3}}. \quad (1)$$

The lower level of the common-mode range of telescopic operational amplifier 100 occurs when the voltage on node 'out' is sufficiently low enough to cause device N3 to enter into the triode region of operation of a MOS device (i.e., linear region or Ohmic region, hereinafter, "triode region"), resulting in a reduction in the output resistance of device N3. If device N3 is in the triode region, then looking into device N3, the resistance is:

$$r_{oN1}+ron_{N3}\approx r_{oN1}=\frac{1}{gds_{N1}}.$$

Looking into device P3, the resistance is:

$$\frac{gm_{P3}}{gds_{P1}gds_{P3}}.$$

If the p-load devices and the p-cascode devices are in saturation, then the output resistance $r_o$ of telescopic operational amplifier 100 is:

$$\frac{1}{gds_{N1}}\bigg\|\frac{gm_{P3}}{gds_{P1}gds_{P3}}=\frac{1}{gds_{N1}+\frac{gds_{P1}gds_{P3}}{gm_{P3}}}$$

$$=\frac{gm_{P3}}{gm_{P3}gds_{N1}+gds_{P1}gds_{P3}}.$$

Thus, the open loop gain of telescopic operational amplifier 100 is simplified to:

$$A_{OL\_n\_triode\_p\_sat}=-gm_{N1}r_o \quad (2)$$

$$=\frac{-gm_{N1}gm_{P3}}{gm_{P3}gds_{N1}+gds_{P1}gds_{P3}}.$$

The upper level of the common-mode range of telescopic operational amplifier 100 occurs when the voltage on node 'out' is sufficiently high enough to cause device P3 to enter into the triode region, resulting in the lowering of the output resistance of device P3. Looking into device N3, $$r_{oN3}(1+gm_{N3}\times r_{oN1})=r_{oN3}\left(1+\frac{gm_{N3}}{gds_{N1}}\right)\approx\frac{gm_{N3}}{gds_{N1}gds_{N3}}.$$

If the p-load devices and the p-cascode devices are in the triode region, then looking into device P3, $$r_{oP1}+r_{oP3}\approx r_{oP1}=\frac{1}{gds_{P1}}.$$

Therefore, the output resistance of telescopic operational amplifier 100 is:

$$\frac{gm_{N3}}{gds_{N1}gds_{N3}}\bigg\|\frac{1}{gds_{P1}}=\frac{1}{\frac{gds_{N1}gds_{N3}}{gm_{N3}}+gds_{P1}}$$

$$=\frac{gm_{N3}}{gds_{N1}gds_{N3}+gds_{P1}gm_{N3}}.$$

Thus, the open loop gain of telescopic operational amplifier 100 is:

$$A_{OL\_n\_sat\_p\_triode}=-gm_{N1}r_o \quad (3)$$

$$=\frac{-gm_{N1}gm_{N3}}{gds_{N1}gds_{N3}+gm_{N3}gds_{P1}}.$$

For example, if gm/gds=20, equations (2) and (3) show a 10.5 times or 20.4 dB drop in open loop gain when device N3 or device P3 enters the triode region. The reduction in open loop gain results in an increased input offset voltage of telescopic operational amplifier 100, which is undesirable for applications such as high precision transconductance amplifiers and high precision voltage amplifiers. In an exemplary transconductance amplifier application, the offset voltage at the output of telescopic operational amplifier 100 results in a DC shift of a control voltage in a high-gain voltage controlled oscillator (VCO), which results in a shift in the VCO frequency. Although the feedback of a phase-locked loop will eventually correct for the voltage offset, the offset voltage compromises voltage headroom. Such an offset voltage can result in erroneous measurements.

Figure 2:
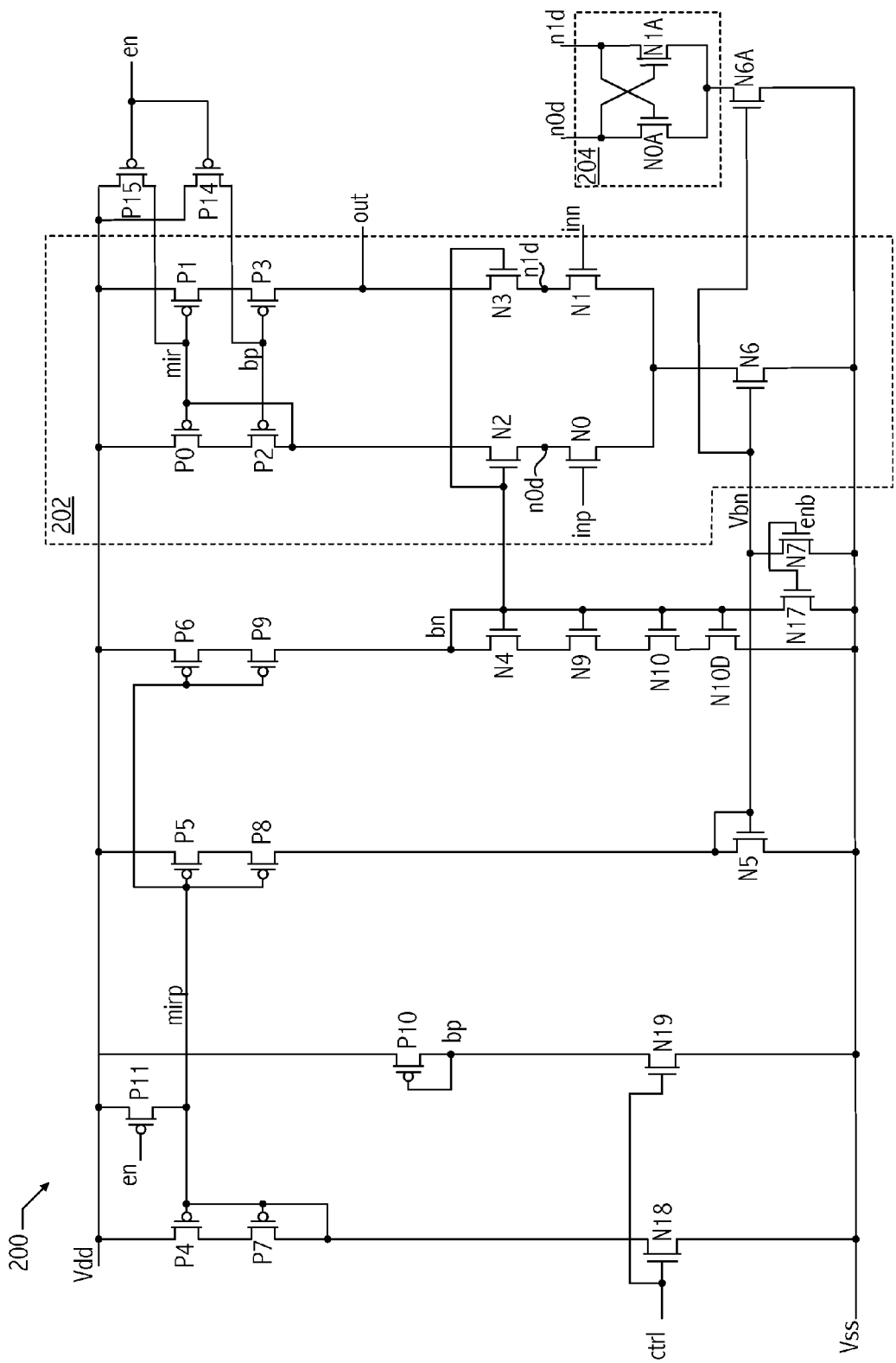
FIG. 2 illustrates a circuit diagram of an exemplary wide-swing telescopic operational amplifier consistent with at least one embodiment of the invention.

Referring to FIG. 2, in at least one embodiment, a wide-swing telescopic operational amplifier (e.g., wide-swing telescopic operational amplifier 200) has a reduced input offset voltage in a closed loop condition, wider input and output common-mode voltage swing as compared to telescopic operational amplifier 100. Telescopic operational amplifier 200 includes a differential input stage (e.g., devices N0 and N1, which are coupled to nodes 'inp' and 'inn,' respectively) and a single-ended output node (e.g., node 'out'). However, techniques described herein are not limited thereto. For example, at least one embodiment of a wide-swing telescopic operational amplifier includes a differential output stage.

In at least one embodiment, wide-swing telescopic operational amplifier 200 includes an amplifier core circuit (e.g., circuit 202) which includes components similar to that of telescopic amplifier circuit 100. Circuit 202 includes a differential input stage (e.g., devices N0 and N1), a cascode circuit including n-type cascode devices (e.g., devices N2 and N3), p-type load devices (e.g., devices P0 and P1), and a cascode circuit including p-type cascode devices (e.g., devices P2 and P3). In at least one embodiment of a wide-swing telescopic operational amplifier, a current source (e.g., device N6) provides a bias current for circuit 202. In at least one embodiment of a wide-swing telescopic operational amplifier, a current source formed by devices P6 and P9 injects current into devices N4, N9, N10, and N10D to thereby establish a voltage for cascode device N2 and cascode device N3 on node 'bn.' In at least one embodiment of a wide-swing telescopic operational amplifier, a current source including device N19 injects current into device P10 to establish a voltage (e.g., voltage on node 'bp') to drive the gates of cascode devices P2 and P3. In at least one embodiment of a wide-swing telescopic amplifier circuit, the outputs of the input stage (e.g., the drains of devices N0 and N1 forming the differential input stage) are also connected to the output of a negative transconductance circuit, (e.g., negative transconductance circuit 204) through nodes 'n0d' and 'n1d.' Negative transconductance circuit 204 receives a bias current supplied by device N6A. The positive output resistance of devices N0 and N1 in parallel with the negative transconductance of devices N0A and N1A enhances (i.e., increases) the output resistance of telescopic amplifier 200 as compared to the output of telescopic amplifier 100.

In at least one embodiment, wide-swing telescopic operational amplifier 200 is configured as a unity buffer (e.g., the output node 'out' is coupled to input node 'inn'). The transconductance of circuit 204 is:

$$gm_{neg\_gm} = -(2I_d \mu_{eff} C_{ox} W/L)^{0.5}, \quad (4)$$

where W and L are the effective channel width and length of each of devices N0A and N1A, $C_{ox}$ is the gate oxide capacitance per unit area of each of devices N0A and N1A, $I_d$ is the drain current of each of devices N0A and N1A, and $\mu_{eff}$ is the effective mobility of majority carrier in the channel region of each of devices N0A and N1A. Under normal operating conditions, all devices in circuit 102 and circuit 204 operate in the saturation region. The negative transconductance of circuit 204 compensates the conductance of device N1 (i.e., $gds_{N1}$). The open loop gain of the wide-swing telescopic operational amplifier is derived from equation (1) by replacing the $gds_{N1}$ term with ($gds_{N1} + gm_{neg\_gm}$), as given by the following equation:

$$A_{OL\_n\_sat\_p\_sat} = \frac{-gm_{N1}gm_{N3}gm_{P3}}{gm_{P3}(gds_{N1} + gm_{neg\_gm})gds_{N3} + gm_{N3}gds_{P1}gds_{P3}}. \quad (5)$$

Since the term $gm_{neg\_gm}$ is negative, the magnitude of the sum of $gds_{N1} + gm_{neg\_gm}$ is less than the corresponding term ($gds_{N1}$) in equation (1). In at least one embodiment of a wide-swing telescopic operational amplifier, a perfect cancellation condition occurs when $$gm/gds = 20$$

and $$gds_{N1} + gm_{neg\_gm} = 0. \quad (6)$$

Under such conditions, equation (5) becomes $$A_{OL\_n\_sat\_p\_sat} = \frac{-gm_{N1}gm_{N3}gm_{P3}}{gm_{N3}gds_{P1}gds_{P3}}. \quad (7)$$

Equation (7), which corresponds to wide-swing telescopic operational amplifier 200, has a 2× (i.e., 6 dB) improvement in open loop gain as compared to equation (2), which corresponds to telescopic operational amplifier 100 of FIG. 1.

In at least one embodiment of wide-swing telescopic operational amplifier 200, the magnitude of $gm_{neg\_gm}$ is greater than $gds_{N1}$, resulting in the term $gm_{P3}(gds_{N1} + gm_{neg\_gm})gds_{N3}$ of equation (5) being negative. Accordingly, $gm_{neg\_gm}$ is chosen so that the negative term, $gm_{P3}(gds_{N1} + gm_{neg\_gm})gds_{N3}$, substantially reduces or eliminates effects of the positive term, $gm_{N3} gds_{P1}gds_{P3}$. As a result, the denominator of equation (5) is smaller than $gm_{N3} gds_{P1}gds_{P3}$, increasing the open loop gain even further. In at least one embodiment, wide-swing telescopic operational amplifier 200 is configured in a feedback configuration and the magnitude of $gm_{neg\_gm}$ has a value that maintains a positive magnitude of the denominator over all values of process, voltage, and temperature and prevents a sign inversion in the open loop gain equation.

In at least one embodiment of wide-swing telescopic operational amplifier 200, the lower voltage level of the common-mode range occurs when the voltage on the input node is low enough to cause device N3 to enter into the triode region of MOSFET operation. Under those conditions, the output resistance of N3 is reduced and wide-swing telescopic operational amplifier 200 has an open loop gain of $$A_{OL\_n\_triode\_p\_sat} = -gm_{N1}r_o \quad (8)$$

$$= \frac{-gm_{N1}gm_{P3}}{gm_{P3}(gds_{N1} + gm_{neg_{gm}}) + gds_{P1}gds_{P3}}.$$

The negative transconductance of circuit 204 increases the output resistance of the transconductance operational amplifier, thereby improving (i.e., decreasing) the lower voltage level of the common-mode range of wide-swing telescopic operational amplifier 200 and increasing the common-mode range.

In at least one embodiment of wide-swing telescopic operational amplifier 200, when the voltage on the input node 'inp' is high enough to cause device P3 to enter into the triode region of MOSFET operation, the output resistance of P3 is reduced and wide-swing telescopic operational amplifier 200 has an open loop gain of $$A_{OL\_n\_sat\_p\_triode} = -gm_{N1}r_o \quad (9)$$

$$= \frac{-gm_{N1}gm_{N3}}{(gds_{N1} + gm_{neg\_gm})gds_{N3} + gm_{N3}gds_{P1}}.$$

For example, when device N3 enters the triode region of operation of a MOSFET, gm/gds=20, and $gds_{N1} + gm_{neg\_gm} = 0$, equation (8) provides that wide-swing telescopic operational amplifier 200 has a 21× or 26.4 dB improvement in open loop gain when device N3 operates in the triode region as compared to equation (2), which corresponds to telescopic operational amplifier 100 of FIG. 1. However, even though ($gds_{N1}+gm_{neg\_gm}$) achieves perfect cancellation (=0), the overall effect is insignificant when device P3 operates in the triode region. Since the magnitude of the denominator is dominated by $gm_{N3}$, equation (9) shows little improvement when compared to equation (3) of telescopic operational amplifier 100 of FIG. 1 when device P3 operates in the triode region. In at least one embodiment of wide-swing telescopic operational amplifier 200, the magnitude $gm_{neg\_gm}$ is increased as compared to the magnitude of $gds_{N1}$, in order to improve (i.e., increase) the upper voltage level of the common-mode range and increasing the common-mode range of wide-swing telescopic operational amplifier 200.

Figure 3:
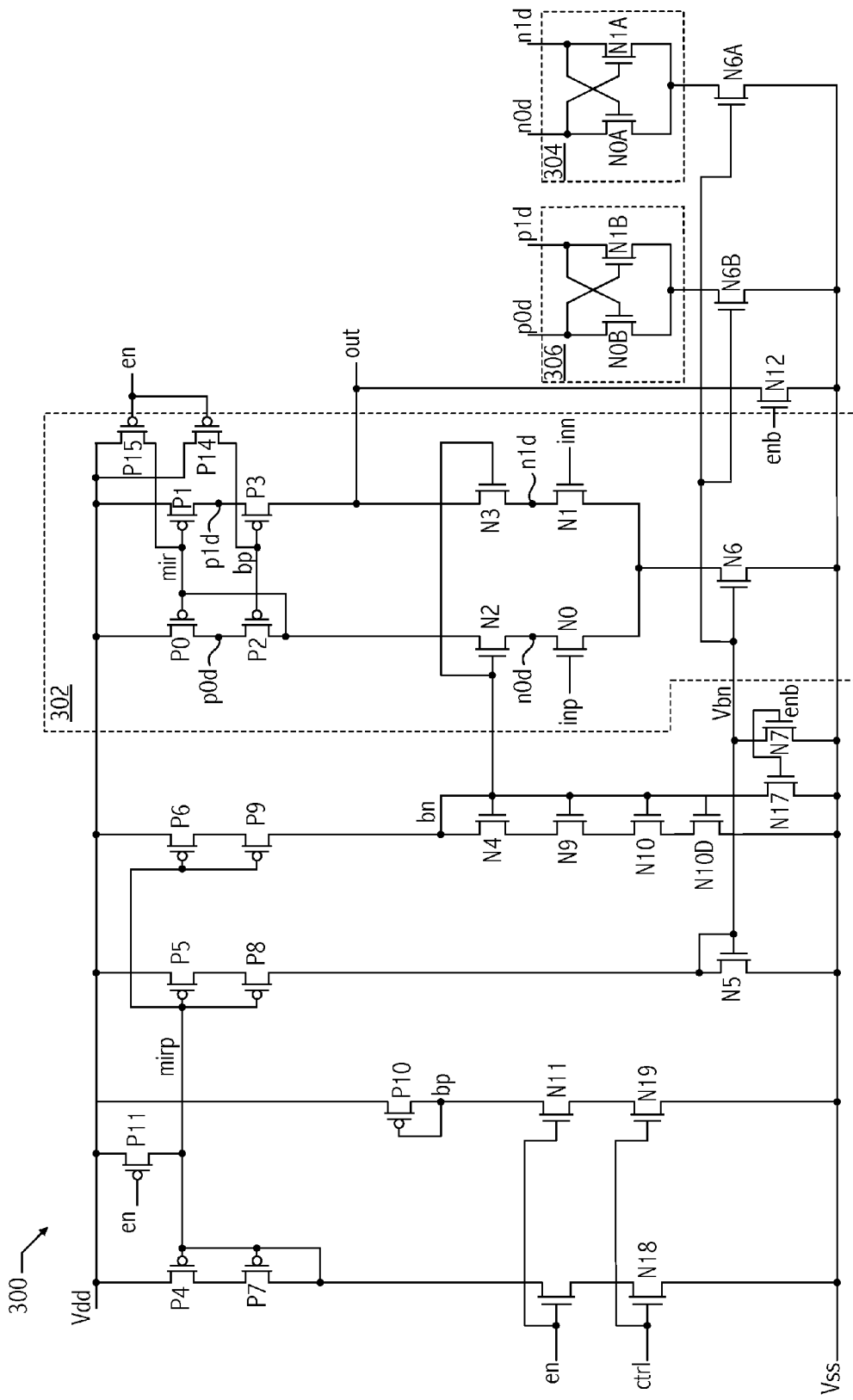
FIG. 3 illustrates a circuit diagram of an exemplary wide-swing telescopic operational amplifier consistent with at least one embodiment of the invention.

Referring to FIG. 3, in at least one embodiment of a wide-swing telescopic operational amplifier (e.g., wide-swing telescopic operational amplifier 300), in order to increase the upper voltage level of the common-mode range of wide-swing telescopic operational amplifier 200, the term $gds_{P1}$ is compensated by using a second negative transconductance circuit (e.g., circuit 306 of circuit 300 of FIG. 3). Circuit 300 includes circuit 302 and associated bias circuitry. Circuit 302 includes a differential input stage (e.g., devices N0 and N1), n-type cascode devices (e.g., devices N2 and N3), p-type load devices (e.g., devices P0 and P1), and p-type cascode devices (e.g., devices P2 and P3). In at least one embodiment of a wide-swing telescopic operational amplifier, a current source (e.g., device N6) provides a bias current for circuit 302. The cascode voltage for devices N2 and N3 on node 'bn' is established by a current source including devices P6 and P9, which injects current into devices N4, N9, N10, and N10D. The cascode voltage for devices P2 and P3 (voltage on node 'bp') is established by a current source including device N19, which injects current into P10 through device N11.

In at least one embodiment, circuit 304 includes devices N0A and N1A, which form a negative transconductance circuit biased by a current provided by a current source (e.g., device N6A). The drains of devices N0A and N1A are connected in parallel with the drains of devices N0 and N1 through nodes 'n0d' and 'n1d.' In addition, wide-swing telescopic operational amplifier 300 includes devices N0B and N1B, which form another negative transconductance circuit (e.g., circuit 306), which is biased by a current provided by a current source (e.g., device N6B). The outputs of devices N0B and N1B are connected in parallel with the drains of devices P0 and P1 via nodes 'p0d' and 'p1d' and biased by a current supplied by a current source (e.g., device N6B). The positive output resistances of devices N0 and N1 are in parallel with the negative transconductances of devices N0A and N1A, and the positive output resistance of devices P0 and P1 are in parallel with the negative transconductances of devices N0B and N1B, thereby enhancing (i.e., increasing) the output resistance of wide-swing telescopic operational amplifier 300.

In at least one embodiment of wide-swing telescopic operational amplifier 300, the common-mode range is greater than that of wide-swing telescopic operational amplifier 200, when the wide-swing operational amplifiers are connected as unity buffers, such that nodes 'out' are connected to corresponding nodes 'inn.' The transconductance of circuit 304 is:

$$gm_{neg\_gmA}=-(2I_{dA}\mu_{eff}C_{oxA}W_A/L_A)^{0.5}, \quad (10)$$

and the transconductance of circuit 306 is:

$$gm_{neg\_gmB}=-(2I_{dB}\mu_{eff}C_{oxB}W_B/L_B)^{0.5}, \quad (11)$$

where $W_A$ and $L_A$ are the effective channel width and length, respectively, of each of devices N0A and N1A; $W_B$ and $L_B$ are the effective channel width and length, respectively, of each of devices N0B and N1B; $C_{ox}$ is gate oxide capacitance per unit area of each of devices N0A, N1A, N0B, and N1B; $I_{dA}$ is the drain current of each of devices N0A and N1A; $I_{dB}$ is the drain current of each of devices N0B and N1B; and $\mu_{eff}$ is effective mobility of majority carrier in the channel region of each of devices N0A, N1A, N0B, and N1B.

In at least one embodiment of circuit 300, under normal operation, all devices in circuit 302, circuit 304, and circuit 306 operate in the saturation region of MOSFET operation. The open loop gain of the operational amplifier is:

$$A_{OL\_n\_sat\_p\_sat}=-gm_{N1}r_o \quad (12)$$
$$= \frac{-gm_{N1}gm_{N3}gm_{P3}}{gm_{P3}(gds_{N1}+gds_{neg\_gmA})gds_{N3}+gm_{N3}(gds_{P1}+gds_{neg\_gmB})gds_{P3}}.$$

Since the terms $gm_{neg\_gmA}$ and $gm_{neg\_gmB}$ are negative, the magnitude of the denominator is reduced from the denominator of equation (1), which is the open loop gain of telescopic operational amplifier 100. The negative transconductance of circuit 304 (i.e., $gm_{neg\_gmA}$) compensates a first component (i.e., the conductance of device N1 ($gds_{N1}$)) of the output resistance of telescopic operational amplifier 300. The negative transconductance of circuit 306 (i.e., $gm_{neg\_gmB}$) compensates a second component (i.e., the conductance of device P1 ($gds_{P1}$)) of the output resistance of telescopic operational amplifier 300. Under ideal conditions, perfect cancellation is achieved and $$gds_{N1}+gm_{neg\_gmA}=0, gds_{P1}+gm_{neg\_gmB}=0, \quad (13)$$

and $$A_{OL\_n\_sat\_p\_sat}=-\infty. \quad (14)$$

In at least one embodiment of a wide-swing telescopic operational amplifier 300, when in a feedback configuration, the magnitude of $gm_{neg\_gmA}$ is smaller than the magnitude of $gds_{N1}$, and the magnitude of $gm_{neg\_gmB}$ is smaller than the magnitude of $gds_{P1}$, resulting in the magnitude of the denominator being positive over all process, voltage and temperature corners, in order to prevent a sign inversion in the open loop gain.

In at least one embodiment of a wide-swing telescopic operational amplifier 300, when a voltage on node 'inp' is sufficiently low enough to cause device N3 to enter into the triode region of operation, the output resistance of device N3 is reduced and the amplifier reaches a lower limit of the common-mode range. The open loop gain of the operational amplifier becomes $$AOL_{n\_triode\_p\_sat} = \frac{-gm_{N1}gm_{P3}}{gm_{P3}(gds_{N1}+gm_{neg\_gmA})+(gds_{P1}+gm_{neg\_gmB})gds_{P3}}. \quad (15)$$

In at least one embodiment of wide-swing telescopic operational amplifier 300, when the voltage on node 'inp' is sufficiently high to cause device P3 to enter into the triode region of operation, the output resistance of device P3 is reduced and the amplifier reaches a limit of the upper common-mode range. The open loop gain of the operational amplifier becomes $$AOL_{n\_sat\_p\_triode} = \frac{-gm_{N1}gm_{N3}}{(gds_{N1} + gm_{neg\_gmA})gm_{N3} + gm_{N3}(gds_{P1} + gm_{neg\_gmB})}. \quad (16)$$

In at least one embodiment of wide-swing telescopic operational amplifier 300, the value of $gm_{neg\_gmA}$ is chosen to increase the output resistance of wide-swing telescopic operational amplifier 300 when device N3 operates in the triode region and the value of gm $gm_{neg\_gmB}$ is chosen to increase the output resistance of wide-swing telescopic operational amplifier 300 when device P3 operates in the triode region. Those increases in output resistance improve (i.e., decrease) the lower voltage level of the common-mode range and improve (i.e., increase) the upper voltage level of the common-mode range, respectively, thereby increasing the common-mode range of wide-swing telescopic operational amplifier 300. In at least one embodiment of wide-swing telescopic operational amplifier 300, gm/gds=20, $gdS_{N1} + gm_{neg\_gmA} = 0$ and $gds_{P1} + gm_{neg\_gmB} = 0$, and equation (15) and equation (16) reduce to negative infinity.

The improved open loop gain of wide-swing telescopic operational amplifier 300 as compared to telescopic operational amplifier 100 results in an improved (i.e., reduced) input offset voltage of the amplifier, which is desirable in a transconductance buffer and high-precision voltage amplifier implementations. In addition, the common-mode range is expanded (i.e., increased) as compared to the common-mode range of telescopic operational amplifier 100.

In at least one embodiment of wide-swing telescopic operational amplifier 300, the negative transconductances provided by cross-coupled devices N0A and N1A and cross-coupled devices N0B and N1B are tuned to offset the positive gds of devices N0 and N1 and devices P0 and P1, respectively, by adjusting the tail current provided by respective ones of devices N6A and N6B to achieve a high open loop DC gain. A theoretical maximum open loop gain is infinite. In at least one embodiment, wide-swing telescopic operational amplifier 300 achieves an open loop gain of approximately 60 dB, which is a 6× improvement over telescopic operational amplifier 100. The tuning of current source devices N6A and N6B are tuned by adjusting the sizes of those devices by any suitable technique. The magnitude of the negative transconductance is tuned to be smaller than the magnitude of gds over all values of process, voltage, and temperature. Note that aside from a slight shift in bandwidth in a unity buffer configuration, wide-swing telescopic operational amplifier 300 has a similar frequency and phase response, as well as noise behavior, as compared to telescopic operational amplifier 100.

In at least one embodiment, a wide-swing telescopic operational amplifier has increased input and output common-mode ranges as compared to a conventional telescopic operational amplifier. The extended input and output common-mode ranges are achieved using a negative transconductance feedback technique. In addition, a wide-swing telescopic operational amplifier consistent with the teachings herein has additional advantages of improved open loop gain, improved input offset voltage, and a small device count overhead. Those advantages are gained with an insignificant effect on the output noise of the operational amplifier. Since the negative transconductance feedback technique uses small devices in the negative transconductance feedback circuit, the technique increases power consumption by an insignificant amount. As a result, a wide-swing telescopic operational amplifier consistent with the teachings herein is a power efficient, compact solution to high performance operational amplifier design with insubstantial overhead. Embodiments of wide-swing telescopic operational amplifiers disclosed herein may be used to realize a high precision unity gain buffer for an analog to digital converter, loop filters of a phase-locked loop, or in other suitable applications.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., HDL, Verilog, GDSII data) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described in embodiments of wide-swing telescopic operational amplifiers in which an n-type input stage and n-type negative transconductance circuits are used, one of skill in the art will appreciate that the teachings herein can be utilized with a p-type input stage and p-type negative transconductance circuits. In addition, note that although embodiments of wide-swing telescopic operational amplifiers described herein include particular input stages and load circuits, one of skill in the art will appreciate that the teachings herein can be utilized with wide-swing telescopic operational amplifiers including other input stages and/or load circuits. Variations and modifications of the embodiments disclosed herein, may be made based on the description set forth herein, without departing from the scope and spirit of the invention as set forth in the following claims.

What is claimed is:

1. An apparatus comprising:
   a telescopic operational amplifier comprising:
     an input stage;
     a load;
     a first cascode circuit including devices of a first type coupled to a first differential node and an output node, wherein the first differential node is coupled to one of the input stage and the load; and
     a second cascode circuit including devices of a second type coupled to a second differential node and the output node, the second differential node being coupled to another of the input stage and the load; and
   a first negative transconductance circuit coupled to the first differential node.

2. The apparatus, as recited in claim 1, wherein the first negative transconductance circuit is operable to provide a negative transconductance to compensate at least a first component of an output resistance of the telescopic operational amplifier.

3. The apparatus, as recited in claim 1, wherein the first negative transconductance circuit comprises a pair of cross-coupled devices coupled to the first differential node and a current source.

4. The apparatus, as recited in claim 3,
wherein the pair of cross-coupled devices includes a first device of the first type and a second device of the first type,
wherein the first and second devices have source terminals coupled to the current source and drain terminals coupled to the first differential node, and
wherein a gate terminal of the first device is coupled to the drain terminal of the second device and a gate terminal of the second device is coupled to the drain terminal of the first device.

5. The apparatus, as recited in claim 1, further comprising:
a second negative transconductance circuit coupled to the second differential node.

6. The apparatus, as recited in claim 5, wherein the first and second negative transconductance circuits comprise only devices of the first type.

7. The apparatus, as recited in claim 6, wherein the first type is n-type, the first negative transconductance circuit is coupled to the input stage, the second negative transconductance circuit is coupled to the load, the input stage includes only n-type devices, and the load includes only p-type devices.

8. The apparatus, as recited in claim 1, wherein the telescopic operational amplifier further comprises:
at least one current source coupled to the input stage and coupled to a first power supply node,
wherein the input stage comprises at least one differential pair of input devices, and
wherein the load comprises at least one pair of devices coupled to a second power supply node.

9. The apparatus, as recited in claim 1, wherein a magnitude of the negative transconductance is greater than or equal to a magnitude of a conductance (gds) of the one of the input stage and the load.

10. A method comprising:
compensating at least a first component of an output resistance of a telescopic operational amplifier by using a negative transconductance, the compensating comprising:
operating a first device in a first cascode circuit coupled to an output node of the telescopic operational amplifier in a triode region of device operation; and
operating a second device in a second cascode circuit coupled to the output node in the triode region of device operation.

11. The method, as recited in claim 10, wherein the negative transconductance compensates for a component of the output resistance associated with at least one of an input stage of the telescopic operational amplifier and a load of the telescopic operational amplifier.

12. The method, as recited in claim 10, further comprising:
compensating a second component of the output resistance of the telescopic operational amplifier by using a second negative transconductance.

13. The method, as recited in claim 12, wherein the second negative transconductance compensates for another of the input stage of the telescopic operational amplifier and the load of the telescopic operational amplifier.

14. The method, as recited in claim 10, wherein the compensating increases the output resistance of the telescopic operational amplifier and increases the common-mode range of the telescopic operational amplifier.

15. The method, as recited in claim 10, wherein the first device is a cascode device coupled to an input stage of the telescopic operational amplifier.

16. The method, as recited in claim 10, wherein the second device is a cascode device coupled to a load of the telescopic operational amplifier.

17. The method, as recited in claim 10, wherein the negative transconductance is generated by a pair of cross-coupled devices coupled to at least one of a load of the telescopic operational amplifier and an input stage of the telescopic operational amplifier.

18. The method, as recited in claim 10, wherein the compensating increases a common-mode range of an output of the telescopic operational amplifier.

19. The method, as recited in claim 10, wherein a magnitude of the negative transconductance is based on a bias current used to provide the negative transconductance.

20. A non-transitory computer-readable medium encoding a representation of an integrated circuit that comprises:
a telescopic operational amplifier comprising;
an input stage;
a load;
a first cascode circuit including devices of a first type coupled to a first differential node and an output node, wherein the first differential node is coupled to one of the input stage and the load; and
a second cascode circuit including devices of a second type coupled to a second differential node and the output node, the second differential node being coupled to another of the input stage and the load; and
a first negative transconductance circuit coupled to the first differential node.

21. The non-transitory computer-readable medium encoding a representation of an integrated circuit, as recited in claim 20, wherein the first negative transconductance circuit comprises a pair of cross-coupled devices coupled to the first differential node and a current source.

22. The non-transitory computer-readable medium encoding a representation of an integrated circuit, as recited in claim 21,
wherein the pair of cross-coupled devices includes a first device of the first type and a second device of the first type,
wherein the first and second devices have source terminals coupled to the current source and drain terminals coupled to the first differential node, and
wherein a gate terminal of the first device is coupled to the drain terminal of the second device and a gate terminal of the second device is coupled to the drain terminal of the first device.

* * * * *